United States Patent
Lee et al.

(10) Patent No.: US 8,339,159 B2
(45) Date of Patent: Dec. 25, 2012

(54) INPUT BUFFER CIRCUIT OF SEMICONDUCTOR APPARATUS

(75) Inventors: Ji-Wang Lee, Gyeonggi-do (KR);
Yong-Ju Kim, Gyenoggi-Do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 174 days.

(21) Appl. No.: 12/540,496

(22) Filed: Aug. 13, 2009

(65) Prior Publication Data
US 2010/0039142 A1 Feb. 18, 2010

(30) Foreign Application Priority Data

Aug. 13, 2008 (KR) .................. 10-2008-0079626
Jul. 20, 2009 (KR) .................. 10-2009-0065861

(51) Int. Cl.
*H03K 5/153* (2006.01)
(52) U.S. Cl. ........................................ 327/77
(58) Field of Classification Search ............ 327/77
See application file for complete search history.

(56) References Cited

U.S. PATENT DOCUMENTS

| 5,942,942 | A | 8/1999 | Wang |
| 6,573,779 | B2 | 6/2003 | Sidiropoulos et al. |
| 6,636,098 | B1 | 10/2003 | Kizer |
| 6,774,722 | B2 * | 8/2004 | Hogervorst ............... 330/258 |
| 7,352,207 | B2 | 4/2008 | Garlapati et al. |
| 2002/0175739 | A1 | 11/2002 | Sidiropoulos et al. |
| 2008/0048778 | A1 | 2/2008 | Lee et al. |
| 2008/0247250 | A1 * | 10/2008 | Joo et al. ............... 365/210.1 |

FOREIGN PATENT DOCUMENTS

| JP | 08-180688 | 7/1996 |
| KR | 1020050108046 | 11/2005 |
| KR | 1020060112951 | 11/2006 |
| KR | 100728572 | 6/2007 |
| KR | 1020080061737 | 7/2008 |
| KR | 1020100020841 | 2/2010 |

* cited by examiner

*Primary Examiner* — Lincoln Donovan
*Assistant Examiner* — Daniel Rojas
(74) *Attorney, Agent, or Firm* — Venable LLP; Jeffri A. Kaminski

(57) ABSTRACT

The input buffer circuit of a semiconductor apparatus includes a first buffering unit that that is activated by a voltage level difference between a first voltage terminal and a second voltage terminal, and generates a first compare signal and a second compare signal by comparing the voltage levels of reference voltage and an input signal; a control unit that controls the amount of current flowing between the second voltage terminal and a ground terminal by comparing the voltage levels of the reference voltage and the second compare signal; and a second buffering unit that generates an output signal by comparing the voltage levels of the input signal and the first compare signal.

9 Claims, 8 Drawing Sheets

INPUT BUFFER CIRCUIT OF SEMICONDUCTOR APPARATUS

CROSS-REFERENCES TO RELATED PATENT APPLICATION

The present application claims priority under 35 U.S.C 119(a) to Korean Application Nos. 10-2008-0079626, filed on Aug. 13, 2008 and 10-2009-0065861, filed on Jul. 20, 2009 respectively in the Korean Intellectual Property Office, which is incorporated herein by reference in its entirety as set forth in full.

BACKGROUND

1. Technical Field

The embodiment described herein relates to a semiconductor apparatus, particularly an input buffer circuit.

2. Related Art

Conventionally, an input buffer, as shown in FIG. 1, includes a first buffering unit 10 and a second buffering unit 20.

The first buffering unit 10 generates first and second compare signals 'com_s1', 'com_s2' by comparing the levels of the voltage of an input signal 'in' and reference voltage 'Vref'. For example, the first buffering unit 10 generates the first compare signal 'com_s1' at a lower voltage level than the voltage level of the second compare signal 'com_s2', when the voltage level of the input signal 'in' is higher than the level of the reference voltage 'Vref'. Further, the first buffering unit 10 generates the first compare signal 'com_s1' at a higher voltage level than the voltage level of the second compare signal 'com_s2', when the voltage level of the input signal 'in' is lower than the level of the reference voltage 'Vref'

The second buffering unit 20 generates an output signal 'out' by comparing the voltage levels of the first compare signal 'com_s1' and the second compare signal 'com_s2'. For example, the second buffering unit 20 outputs the output signal 'out' at a low level, when the voltage level of the first compare signal 'com_s1' is higher than the voltage level of the second compare signal 'com_s2'. Further, the second buffering unit 20 outputs the output signal 'out' at a high level, when the voltage level of the first compare signal 'com_s1' is lower than the voltage level of the second compare signal 'com_s2'.

Conventional input buffer circuits having the above configuration are vulnerable to noise of the reference voltage 'Vref' which is inputted into the first buffering unit 10. For example, when the level of the reference voltage 'Vref' becomes higher than a target level, the voltage level of the second compare signal 'com_s2' decreases. As the voltage level of the second compare signal 'com_s2' decreases, the voltage level of the first compare signal 'com_s1' becomes higher than the voltage level of the second compare signal 'com_s2'. As a result, a problem is generated in that the output signal 'out' should change the voltage level by the change of the voltage level of the input signal 'in', but the output signal 'out' is always fixed to a low level. On the other hand, the voltage level of the output signal 'out' can be fixed to a high level, when the level of the reference voltage 'Vref' becomes lower than the target level. That is, the first buffering unit 10 amplifies noise of the reference voltage 'Vref' and then the second buffering unit 20 compares the second compare signal 'com_s2' with the first compare signal 'com_s1', such that a problem of a fixed level of the output signal 'out' occurs.

An input buffer circuit shown in FIG. 2 is a conventional input buffer circuit designed not to be influenced by noise of reference voltage, which includes a first buffering unit 10-1 and a second buffering unit 20-1, as in FIG. 1.

The first buffering unit 10-1 generates a compare signal 'com_s' by comparing the voltage levels of reference voltage 'Vref' with the input signal 'in'. For example, when the voltage level of the input signal 'in' is higher than the level of the reference voltage 'Vref', the first buffering unit 10-1 generates the compare signal 'com_s' at a lower level than when the voltage level of the input signal 'in' is lower than the level of the reference voltage 'Vref'. Further, when the voltage level of the input signal 'in' is lower than the level of the reference voltage 'Vref', the first buffering unit 10-1 generates the compare signal 'com_s' at a higher level than when the voltage level of the input signal 'in' is higher than the level of the reference voltage 'Vref'.

The second buffering unit 20-1 generates an output signal 'out' by comparing the voltage levels of the input signal 'in' and the compare signal 'com_s'. For example, the second buffering unit 20-1 outputs the output signal 'out' at a high level, when the voltage level of the input signal 'in' is higher than the voltage level of the compare signal 'com_s'. The second buffering unit 20-1 outputs the output signal 'out' at a low level, when the voltage level of the input signal 'in' is lower than the voltage level of the compare signal 'com_s'.

The input buffer circuit of FIG. 2 having the above configuration is less sensitive to noise of the reference voltage 'Vref' than the input buffer circuit shown in FIG. 1. This is because, different from the first buffering unit 10 shown in FIG. 1, the first buffering unit 10-1 does not generate a second compare signal 'com_s2' that is influenced by the reference voltage 'Vref', and the second buffering unit 20-1 does not amplify noise of the reference voltage 'Vref', because it receives only the input signal 'in' and the compare signal 'com_s'.

However, the input buffer circuit shown in FIG. 2 is vulnerable to changes in level of external voltage 'VDD'. The voltage level of the compare signal 'com_s' outputted from the first buffering unit 10-1 is in inverse proportion to the level of bias voltage 'Bias'. That is, the bias voltage 'Bias' is a voltage controlling the degree of turn-on of a transistor N7, and as the level of the bias voltage 'Bias' increases, the degree of turn-on of the transistor N7 increases, such that the voltage level of a node where a resistor R3 and a transistor N8 are coupled, that is, the voltage level of the compare signal 'com_s' decreases. The level of the bias voltage 'Bias' increases in proportion to the level of the external voltage 'VDD'. As a result, as the level of the external voltage 'VDD' increases, the level of the bias voltage 'Bias' increases, and the voltage level of the compare signal 'com_s' decreases on account of the bias voltage 'Bias' with increased voltage level. Since the second buffering unit 20-1 determines the voltage level of the output signal 'out' by comparing the decreased voltage levels of the compare signal 'com_s' with the input signal 'in', the voltage level of the output signal 'out' can be fixed to a high level.

SUMMARY

An input buffer circuit of a semiconductor apparatus capable of normally operating regardless of level changes of reference voltage and external voltage is disclosed herein.

In an embodiment of the present invention, an input buffer circuit of a semiconductor apparatus, includes: a first buffering unit that is configured to be activated by a voltage level difference between a first voltage terminal and a second voltage terminal, and generate a first compare signal and a second compare signal by comparing the voltage levels of reference voltage and an input signal; a control unit configured to control the amount of current flowing between the second voltage terminal and a ground terminal by comparing the voltage levels of the reference voltage and the second compare signal; and a second buffering unit configured to generate an output signal by comparing the voltage levels of the input signal and the first compare signal.

In another embodiment of the present invention, an input buffer circuit of a semiconductor apparatus, includes: a first buffering unit configured to include a first voltage terminal receiving external voltage and a first current controller controlling the amount of current flowing between a second voltage terminal and a ground terminal in proportion to a bias voltage level, and generate a first compare signal and a second compare signal by comparing the voltage level of an input signal with a reference voltage level; a control unit configured to control the amount of current flowing between the second voltage terminal and the ground terminal in inverse proportion to the bias voltage level; and a second buffering unit configured to generate an output signal by comparing the voltage levels of the input signal and the first compare signal.

In another embodiment of the present invention, an input buffer circuit of a semiconductor apparatus includes: a bias voltage level control unit configured to output control bias voltage by dropping bias voltage, when the level of the bias voltage becomes higher than a target level; a first buffering unit configured to generate a compare signal by comparing the voltage level of an input signal with a reference voltage level, when being activated by receiving the control bias voltage; and a second buffering unit configured to generate an output signal by comparing the voltage levels of the input signal and the compare signal.

In another embodiment of the present invention, an input buffer circuit of a semiconductor apparatus includes: a first buffering unit configured to include a voltage dropper decreasing the voltage levels of a first compare signal and a second compare signal in response to the voltage levels of a reference voltage and an input signal, and a voltage applier increasing the voltage levels of the first and second compare signals in response to the voltage levels of the reference voltage and the second compare signal; and a second buffering unit configured to generate an output signal by comparing the voltage levels of the first compare signal and the input signal.

In another embodiment of the present invention, an input buffer circuit of a semiconductor apparatus includes: a first buffering unit configured to include a fixed resistor increasing the voltage level of a first compare signal and a second compare signal by receiving external voltage, and a voltage dropper decreasing the voltage level of the first and second compare signals in response to an input signal and a reference voltage level and controlling the degree of decrease of the voltage level of the first and second compare signals in response to a voltage level difference between the reference voltage and the second compare signal; and a second buffering unit configured to generate an output signal by comparing the voltage levels of the first compare signal and the input signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Preferred embodiments are described hereafter in detail with reference to the accompanying drawings.

Figure 3:
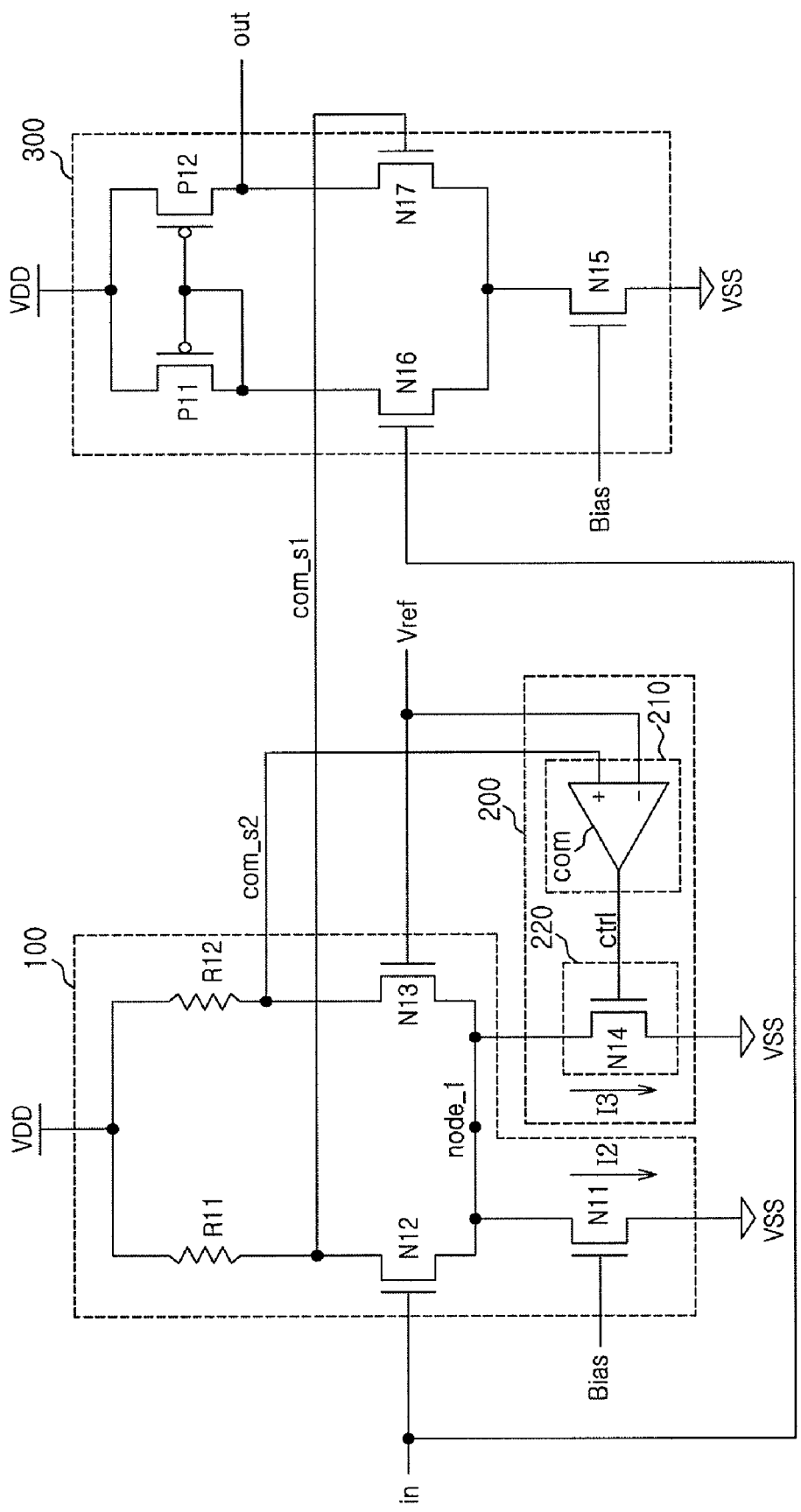
FIG. 3 is a diagram illustrating an input buffer of a semiconductor apparatus according to an embodiment of the present invention.

An input buffer circuit of semiconductor apparatus according to an embodiment of the present invention, as shown in FIG. 3, includes a first buffering unit 100, a control unit 200, and a second buffering unit 300.

The first buffering unit 100 is activated by a level difference between a first voltage terminal and a second voltage terminal. The first buffering unit 100 generates a first compare signal 'com_s1' and a second compare signal 'com_s2' by comparing the voltage levels of reference voltage 'Vref' and an input signal 'in'. For example, the first buffering unit 100 generates the first compare signal 'com_s1' at a lower voltage level than the voltage level of the second compare signal 'com_s2', when the voltage level of the input signal 'in' is higher than the level of the reference voltage 'Vref'. The first buffering unit 100 generates the first compare signal 'com_s1' at a higher voltage level than the voltage level of the second compare signal 'com_s2' when the voltage level of the input signal 'in' is lower than the level of the reference voltage 'Vref'. The first and second compare signals 'com_s1 and com_s2' are signals swinging between CML(Current Mode Logic) levels.

The first buffering unit 100 includes first and second resistors R11, R12 and first to third transistors N11, N12, N13. The first resistor R11 receives external voltage 'VDD' through one end. The second resistor R12 receives the external voltage 'VDD' through one end. The first transistor N11 receives bias voltage 'Bias' through its gate and its drain and source are coupled with a first node 'node_1' and a ground terminal 'VSS', respectively. The second transistor N12 receives the input signal 'in' through a gate and its drain is coupled with the other end of the first resistor R11 and its source is coupled with the first node 'node_1'. The third transistor 'N13' receives the reference voltage 'Vref' through its gate and its drain is coupled with the other end of the second transistor element R12 and its source is coupled with the first node 'node_1'. In this configuration, since the first buffering unit 100 receives the external voltage 'VDD' through the ends of the first and second resistors R11, R12, the first voltage terminal of the first buffering unit 100 is those ends of the first and second resistors R11, R12. The first transistor N11 functions as a current control unit that receives the bias voltage 'Bias' through the gate and adjusts the amount of current flowing to the ground terminal from the first node 'node_1'. Describing the first transistor N11 in detail, it controls the amount of current flowing between the first node 'node_1' and the ground terminal 'VSS', in accordance with the level of the bias voltage 'Bias'. The first node 'node_1' is the second voltage terminal of the first buffering unit 100. Further, the first compare signal 'com_s1' is outputted from the node where the first resistor R11 and the second transistor N12 are coupled. The second compare signal 'com_s2' is outputted from the node where the second resistor R12 and the third transistor N13 are coupled.

The control unit 200 controls the amount of current flowing between the second voltage terminal, i.e., the first node 'node_1' and the ground terminal 'VSS' by comparing the voltage level of the second compare signal 'com_s2' with the level of the reference voltage 'Vref'. For example, the control unit 200 increases the amount of current flowing between the first node 'node_1' and the ground terminal 'VSS', when the voltage level of the second compare signal 'com_s2' is higher than the level of the reference voltage 'Vref'. The control unit 200 decreases the amount of current flowing between the first node 'node_1' and the ground terminal 'VSS', when the voltage level of the second compare signal 'com_s2' is lower than the level of the reference voltage 'Vref'.

The control unit 200 includes a control signal generator 210 and a switch 220.

The control signal generator 210 generates a control signal 'ctrl' by comparing the voltage level of the second compare signal 'com_s2' with the level of the reference voltage 'Vref'. For example, the control signal generator 210 increases the voltage level of the control signal 'ctrl', when the voltage level of the second compare signal 'com_s2' is higher than the level of the reference voltage 'Vref'. The control signal generator 210 decreases the voltage level of the control signal 'ctrl', when the voltage level of the second compare signal 'com_s2' is lower than the level of the reference voltage 'Vref'.

The control signal generator 210 can be implemented by a comparator 'com' that generates the control signal 'ctrl' by comparing the voltage level of the second compare signal 'com_s2' with the level of the reference voltage 'Vref'.

The switch 220 increases or decreases the amount of current flowing between the first node 'node_1' and the ground terminal 'VSS', in response to the voltage level of the control signal 'ctrl'. For example, the switch 220 increases the amount of current flowing between the first node 'node_1' and the ground terminal 'VSS', when the voltage level of the control signal 'ctrl' increases. The switch 220 decreases the amount of current flowing between the first node 'node_1' and the ground terminal 'VSS', when the voltage level of the control signal 'ctrl' decreases. Therefore, the switch 220 can be referred to as a current controller.

The switch 220 can be implemented by a fourth transistor N14 that receives the control signal 'ctrl' through its gate and its drain and source are coupled with the first node 'node_1' and the ground terminal 'VSS', respectively. Since the fourth transistor N14 receives the control signal 'ctrl' through the gate and is coupled between the first node 'node_1' and the ground terminal 'VSS', it is possible to control the amount of current flowing between the first node 'node_1' and the ground terminal 'VSS', in accordance with the voltage level of the control signal 'ctrl'.

The second buffering unit 300 generates an output signal 'out' by comparing the voltage levels of the input signal 'in' with the first compare signal 'com_s1'. For example, the second buffering unit 300 outputs the output signal 'out' at a high level, when the voltage level of the input signal 'in' is higher than the voltage level of the first compare signal 'com_s1'. The second buffering unit 300 outputs the output signal 'out' at a low level, when the voltage level of the input signal 'in' is lower than the voltage level of the first compare signal 'com_s1'. The output signal 'out' is a signal swinging between CMOS(Complementary Metal Oxide Semiconductor) levels.

The second buffering unit 300 includes fifth to ninth transistors N15~N17, P11~P12. The fifth transistor N15 receives the bias voltage 'Bias' through its gate and its source is coupled with a ground terminal 'VSS'. The sixth transistor N16 receives the input signal 'in' through its gate and its source is coupled with the drain of the fifth transistor N15. The seventh transistor N17 receives the first compare signal 'com_s1' through its gate and its source is coupled with the drain of the fifth transistor N15. The eighth transistor P11 receives external voltage 'VDD' through its source and its gate and the drain are coupled with the drain of the sixth transistor N16. The ninth transistor P12 receives the external voltage 'VDD' through its source and its gate is coupled with the gate of the eighth transistor P11 and its drain is coupled with the drain of the seventh transistor N17. In this configuration, the output signal 'out' is outputted from a node where the seventh transistor 'N17' and the ninth transistor 'P12' are coupled.

The input buffer circuit of a semiconductor apparatus having the above configuration according to an embodiment of the present operates as follows.

Figure 1:
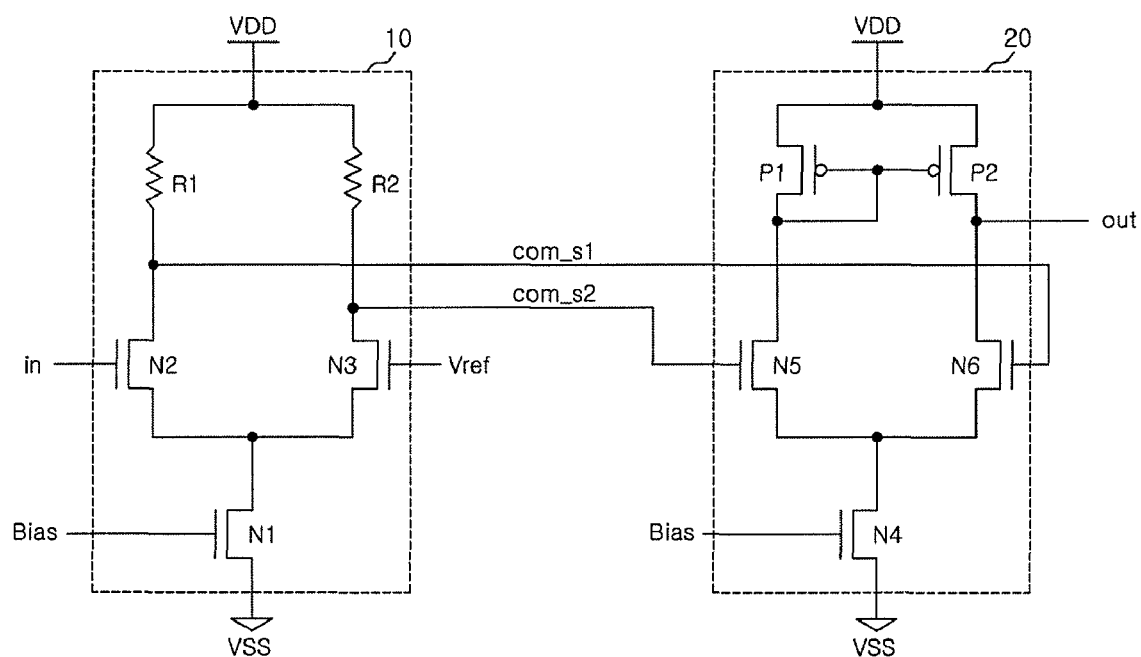
FIG. 1 is a diagram illustrating the configuration of an input buffer circuit according to an embodiment in the conventional art.
Figure 2:
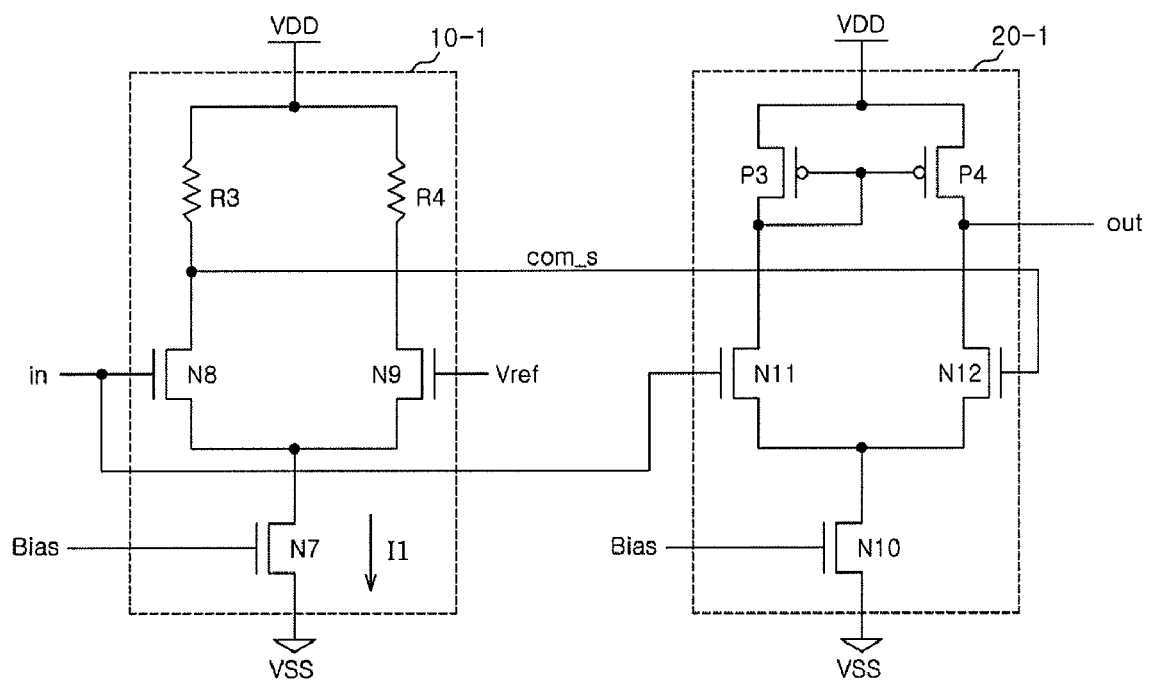
FIG. 2 is a diagram illustrating the configuration of an input buffer circuit according to another embodiment in the conventional art.

The transistor N7 of the input buffer circuit according to the related art shown in FIG. 2 receives the bias voltage 'Bias' and transmits first current I1 to the ground terminal 'VSS'.

The first transistor N11 of the input buffer circuit according to an embodiment of the present invention shown in FIG. 3 receives the bias voltage 'Bias' and transmits second current I2 to the ground terminal 'VSS'. Further, when the fourth transistor N14 receiving the control signal 'ctrl' is turned on, third current I3 is transmitted to the ground terminal 'VSS'. In this process, the size of the first transistor N11 and the fourth transistor N14 is determined such that the total amount of the amount of the second current I2 and the third current I3 may be the same as the amount of the first current I1. That is, the first transistor N11 and the fourth transistor N14 may be designed smaller than the transistor N7 shown in FIG. 2.

The input buffer circuit according to an embodiment of the present invention prevents the voltage level of the first compare signal 'com_s1' from being decreased by the increase of the bias voltage 'Bias' due to the increase of the external voltage 'VDD'.

When the bias voltage 'Bias' is lower than a target level, the voltage level of the second compare signal 'com_s2' is generated higher than the level of the reference voltage 'Vref'. When the voltage level of the second compare signal 'com_s2' is higher than the level of the reference voltage 'Vref', the voltage level of the control signal 'ctrl' increases and the degree of turn-on of the fourth transistor N14 increases. The degree of turn-on of the first transistor N11 receiving the bias voltage 'Bias' decreases with the decrease in the level of the bias voltage 'Bias', the first transistor N11 with the decreased degree of turn-on transmits the second current I2 of which the amount is smaller than when the bias voltage 'Bias' is normal to the ground terminal 'VSS'. On the other hand, the fourth transistor N14 with the increased degree of turn-on transmits the third current I3 of which the amount is larger than when the bias voltage 'Bias' is normal.

As a result, even though the bias voltage 'Bias' becomes lower than the target level, that is, even though the bias voltage 'Bias' becomes lower than when it is normal, the amount of current flowing between the second voltage terminal and the ground terminal 'VSS' of the first buffering unit 100 is constant. In other words, when the first buffering unit 10-1 shown in FIG. 2 receives normal bias voltage 'Bias', the first buffering unit 100 of the input buffer circuit according to an embodiment of the present invention transmits current, of which the amount is the same as the current I1 transmitted to the ground terminal 'VSS', to the ground terminal 'VSS', even if the bias voltage 'Bias' decreases. Therefore, the first buffering unit 100 generates the first compare signal 'com_s1' at the normal level in response to the input signal 'in'. The second buffering unit 300 normally outputs the output signal 'out' by comparing the voltage levels of the first compare signal 'com_s1' and the input signal 'in'.

When the level of the bias voltage 'Bias' becomes higher than the target level, the voltage level of the second compare signal 'com_s2' becomes lower than the level of the reference voltage 'Vref'. When the voltage level of the second compare signal 'com_s2' becomes lower than the level of the reference voltage 'Vref', the voltage level of the control signal 'ctrl' decreases. When the voltage level of the control signal 'ctrl' decreases, the fourth transistor N14 is turned off. Only the first transistor N11 that has been turned on by the bias voltage 'Bias' transmits the second current I2 to the ground terminal 'VSS'. In this process, since the first transistor N11 is smaller in size than the transistor N7 shown in FIG. 2, the bias voltage 'Bias' increases, such that even if the amount of second current I2 increases, the amount of second current I2 becomes the same as the amount as the first current I1 that is transmitted by the transistor N7 of FIG. 2 which has received the normal bias voltage 'Bias'. Therefore, the first compare signal 'com_s1' is generated at a normal voltage level. As a result, the second buffering unit 300 can generate the output signal 'out' by normally comparing the voltage levels of the first compare signal 'com_s1' and the input signal 'in'.

The input buffer circuit of a semiconductor apparatus according to an embodiment of the present invention can output an output signal by normally buffering an input signal, even if bias voltage increases with the increase in the level of external voltage. Further, the input buffer circuit according to an embodiment of the present invention normally performs the buffering operation, even if the level of external voltage increases, such that a semiconductor apparatus having the input buffer circuit has an effect of increasing the operational reliability.

Figure 4:
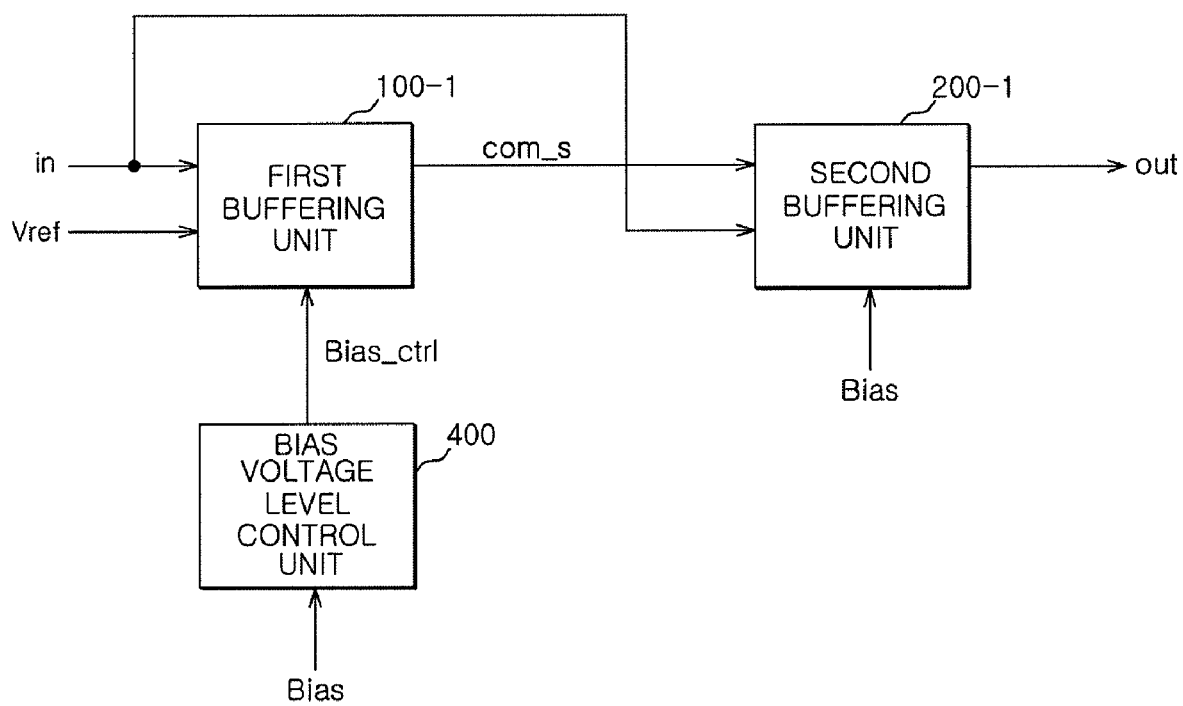
FIG. 4 is a diagram illustrating an input buffer of a semiconductor apparatus according to another embodiment of the present invention.

An input buffer circuit of a semiconductor apparatus according to another embodiment of the present invention, as shown in FIG. 4, includes a first buffering unit 100-1, a second buffering unit 200-1, and a bias voltage level control unit 400.

The first buffering unit 100-1 generates a compare signal 'com_s' by comparing the voltage level of an input signal 'in' with the level of reference voltage 'Vref', when being activated by receiving control bias voltage 'Bias_ctrl'.

The first buffering unit 100-1 may have the same internal structure as the first buffering unit 10-1 shown in FIG. 2, but the control bias voltage 'Bias_ctrl' is applied instead of the bias voltage 'Bias. Accordingly, the detailed description of the first buffering unit 100-1 shown in FIG. 4 is not provided.

The second buffering unit 200-1 generates an output signal 'out' by comparing the voltage levels of the input signal 'in' and the compare signal 'com_s'.

The second buffering unit 200-1 may have the same internal structure as the second buffering unit 20-1 shown in FIG. 2. Accordingly, the detailed description of the second buffering unit 200-1 shown in FIG. 4 is not provided.

The bias voltage level control unit 400 drops the bias voltage 'Bias' and outputs it as the control bias voltage 'Bias_ctrl', when the bias voltage 'Bias' becomes higher than a target level. Further, when the bias voltage 'Bias' is lower than the target level, the bias voltage level control unit 400 outputs the bias voltage 'Bias' as the control bias voltage 'Bias_ctrl'.

Figure 5:
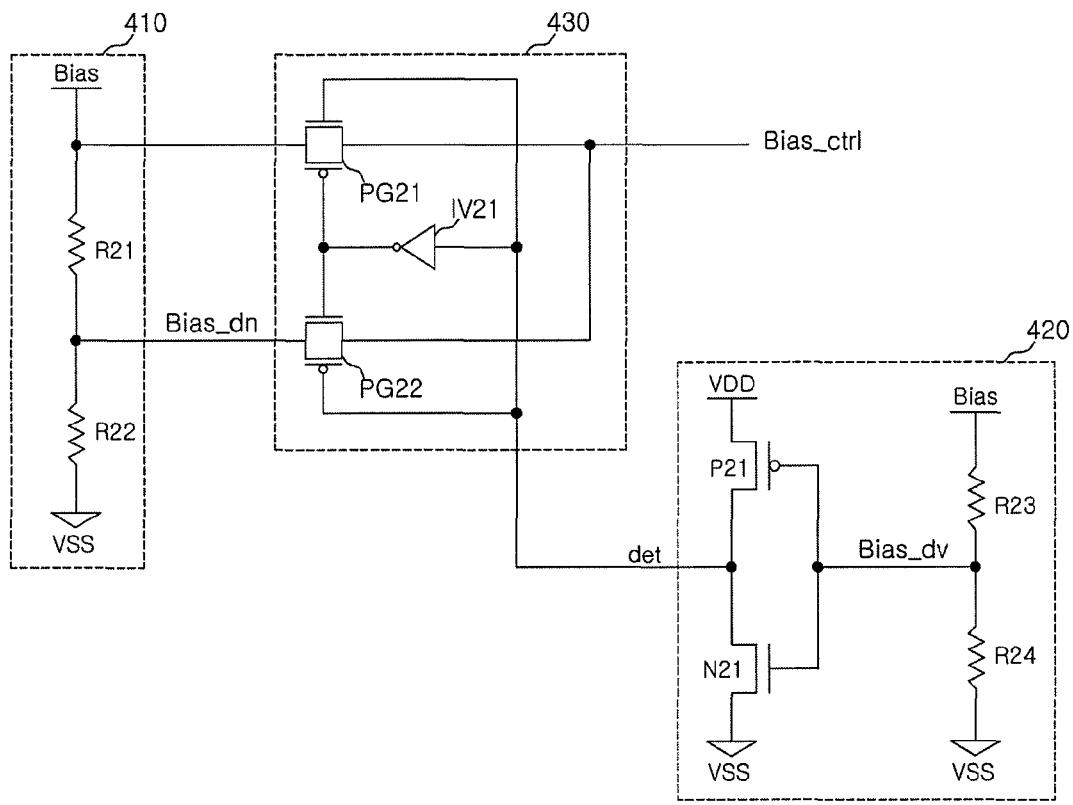
FIG. 5 is a diagram illustrating the configuration of a bias voltage level control unit of FIG. 4.

The bias voltage level control unit 400, as shown in FIG. 5, includes a voltage dropper 410, a level detector 420, and a selector 430.

The voltage dropper 410 generates down voltage 'Bias_dn' by dropping the bias voltage 'Bias'.

The voltage dropper 410 includes third and fourth resistors R21, R22. The third resistor R21 receives the bias voltage 'Bias' through one end. One end of the fourth resistor R22 is coupled with the other end of the third resistor R21 and its other end is coupled with a ground terminal 'VSS'. In this configuration, the down voltage 'Bias_dn' is generated at a node where the third resistor R21 and the fourth resistor R22 are coupled.

The level detector 420 enables a detection signal 'det', when the bias voltage 'Bias' becomes higher than a target level.

The level detector 420 includes fifth and sixth resistors R23, R24 and tenth and eleventh transistors P21, N21. The fifth resistor R23 receives the bias voltage 'Bias' through one end. One end of the sixth resistor R24 is coupled with the other end of the fifth resistor R23 and its other end is coupled with the ground terminal 'VSS'. Division voltage 'Bias_dv' is generated at a node where the fifth and sixth resistors R23, R24 are coupled. The bias voltage 'Bias' is divided based on the resistance ratio of the fifth and sixth resistors R23, R24 and outputted as the division voltage 'Bias_dv'. The tenth transistor P21 receives external voltage 'VDD' through its source and receives the division voltage 'Bias_dv' through its gate. The eleventh transistor N21 receives the division voltage 'Bias_dv' through its gate and its drain is coupled with the drain of the tenth transistor P21 and its source is coupled with the ground terminal 'VSS'. The detection signal 'det' is generated at a node where the tenth transistor P21 and the eleventh transistor N21 are coupled.

The level detector 420 increases the level of the division voltage 'Bias_dv' when the level of the bias voltage 'Bias' is increased, and enables the detection signal 'det' at a low level, when the increased level of the division voltage 'Bias_dv' turns on the eleventh transistor N21. Further, the level detector 420 turns on the tenth transistor P21 and disables the detection signal 'det' at a high level, when the bias voltage 'Bias' is not high enough such that the eleventh transistor N21 is turned on.

The selector 430 outputs the bias voltage 'Bias' as the control bias voltage 'Bias_ctrl', when the detection signal 'det' is disabled at a high level, and outputs the down voltage 'Bias_dn' as the control bias voltage 'Bias_ctrl', when detection signal 'det' is enabled at a low level.

The selector 430 includes first and second pass gate PG21, PG22 and an inverter IV21. The inverter IV21 receives the detection signal 'det'. The first pass gate PG21 receives the bias voltage 'Bias' through the input terminal and receives the detection signal 'det' through a first control terminal, and receives the output signal of the inverter IV21 through a second control terminal. The second pass gate PG22 receives the down voltage 'Bias_dn' through the input terminal, receives the output signal of the inverter IV21 through a first control terminal, and receives the detection signal 'det' through a second control terminal. The control bias voltage 'Bias_ctrl' is outputted from a node where the output terminals of the first pass gate PG21 and the second pass gate P22 are coupled.

The input buffer circuit of a semiconductor apparatus having the above configuration according to another embodiment of the present invention operates as follows.

The bias voltage level control unit 400 outputs control bias voltage 'Bias_ctrl' by dropping the bias voltage 'Bias', when the bias voltage 'Bias' is higher than a target level, and outputs the bias voltage 'Bias' as the control bias voltage 'Bias_ctrl', when the bias voltage 'Bias' is lower than the target level.

As a result, since even if the bias voltage 'Bias' increases, the first buffering unit 100-1 included in the input buffer circuit of a semiconductor apparatus according to another embodiment of the present invention receives the control bias voltage 'Bias_ctrl' with the level decreased, it prevents the voltage level of the compare signal 'com_s' from decreasing. Therefore, the second buffering unit 200-1 normally generates the output signal 'out' by comparing the voltage levels of the input signal 'in' and the compare signal 'com_s'.

Both of the input buffer circuit according to an embodiment of the present invention and the input buffer circuit according to another embodiment of the present invention can normally perform the buffering operation even if the external voltage increases, and since the second buffering units 200, 200-1 compare the input signal 'in' with the compare signals 'com_s', 'com_s1' obtained by amplifying the input signal 'in', it is insensitive to changes of noise of the reference voltage 'Vref'.

Since the input buffer circuit of a semiconductor apparatus according to embodiments of the present invention normally performs the buffering operation regardless of changes of the external voltage or the reference voltage, it has an effect of increasing the operational reliability of a semiconductor apparatus.

Figure 6:
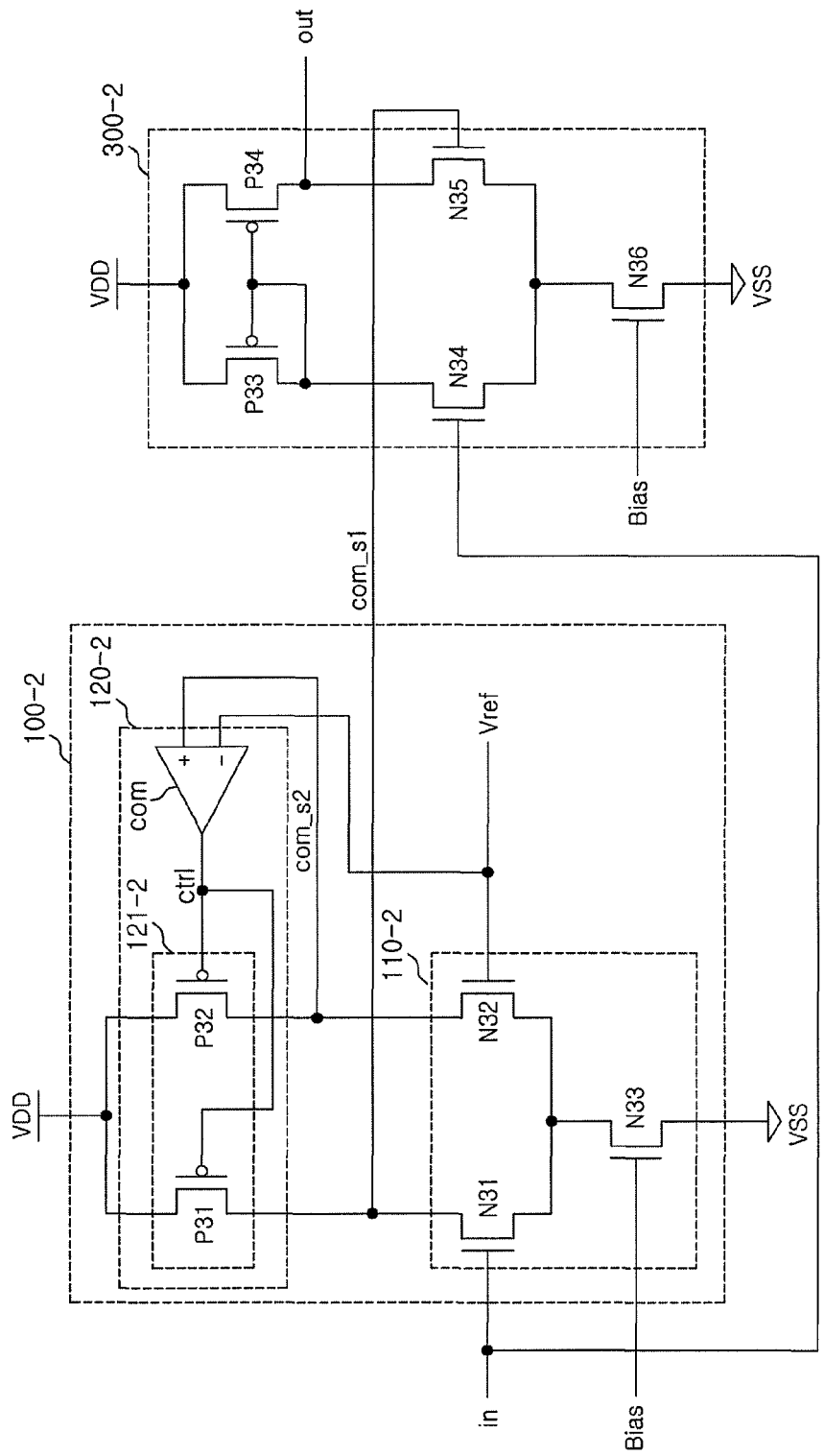
FIG. 6 is a diagram illustrating an input buffer of a semiconductor apparatus according to another embodiment of the present invention.

The input buffer circuit according to another embodiment of the present invention, as shown in FIG. 6, includes a first buffering unit 100-2 and a second buffering unit 300-2.

The first buffering unit 100-2 includes a voltage dropper 110-2 that decreases the voltage level of a first compare signal 'com_s1' and a second compare signal 'com_s2' in response to the voltage level of reference voltage 'Vref' and an input signal 'in', and a voltage applier 120-2 that increases the voltage level of the first and second compare signals 'com_s1', 'com_s2' in response to the voltage level of the reference voltage 'Vref' and the second compare signal 'com_s2'.

The second buffering unit 300-2 generates an output signal 'out' by comparing the voltage levels of the first compare signal 'com_s1' and the input signal 'in'.

The voltage dropper 110-2 decreases the voltage level of the first compare signal 'com_s1' less than the voltage level of the second compare signal 'com_s2', when the voltage level of the input signal 'in' is higher than the level of the reference voltage 'Vref', and decreases the voltage level of the second compare signal 'com_s2' less than the voltage level of the first compare signal 'com_s1', when the voltage level of the input signal 'in' is lower than the level of the reference voltage 'Vref'.

The voltage dropper 110-2 includes first to third transistors N31, N32, N33. The first transistor N31 receives the input signal 'in' through its gate. The second transistor N32 receives the reference voltage 'Vref' through its gate. The third transistor N33 receives bias voltage 'Bias' through its gate, and its drain is coupled with a node where the sources of the first and second transistors N31, N32 are coupled and its source is coupled with ground terminal 'VSS'.

The voltage applier 120-2 increases the voltage level of the first and second compare signals 'com_s1', 'com_s2' more than when the voltage level of the second compare signal 'com_s2' is higher than the level of the reference voltage 'Vref', when the voltage level of the second compare signal 'com_s2' is lower than the level of the reference voltage 'Vref'.

The voltage applier 120-2 includes a comparator 'com' and a variable resistor '121-2'.

The comparator 'com' generates a control signal 'ctrl' by comparing the levels of the second compare signal 'com_s2' and the reference voltage 'Vref'. For example, the comparator 'com' increases the voltage level of the control signal 'ctrl', when the second compare signal 'com_s2' is higher than the level of the reference voltage 'Vref'. Further, the comparator 'com' decreases the voltage level of the control signal 'ctrl', when the second compare signal 'com_s2' is lower than the level of the reference voltage 'Vref'.

The resistance level of the variable resistor 121-2 changes in response to the voltage level of the control signal 'ctrl'. For example, the variable resistor 121-2 increases in resistance level when the voltage level of the control signal 'ctrl' increases, and decreases in resistance level when the voltage level of the control signal 'ctrl' decreases. In this process, the variable resistor 121-2 receives external voltage 'VDD' through one end and the other end is coupled to increase the voltage level of the first and second compare signals 'com_s1' 'com_s2'.

The variable resistor 121-2 includes fourth and fifth transistors P31, P32. The fourth transistor P31 receives control signal 'ctrl' through its gate and receives external voltage 'VDD' through its source, and its drain is coupled with the drain of the first transistor N31. The fifth transistor P32 receives the control signal 'ctrl' through its gate and receives the external voltage 'VDD' through its source, and its drain is coupled with the drain of the second transistor N32. In this configuration, the first compare signal 'com_s1' is generated at a node where the fourth transistor P31 and the first transistor N31 are coupled, and the second compare signal 'com_s2' is generated at a node where the fifth transistor P32 and the second transistor N32.

The second buffering unit 300-2 includes sixth to tenth transistors P33, P34, N34, N35, N36. The sixth transistor P33 receives external voltage 'VDD' through its source, and its gate and drain are coupled. The seventh transistor P34 receives the external voltage through its source and its gate is coupled with the gate of the sixth transistor P33. The eighth transistor N34 receives the input signal 'in' through its gate and its drain is coupled with the drain of the sixth transistor P33. The ninth transistor N35 receives the first compare signal 'com_s1', through its gate and its drain is coupled with the drain of the seventh transistor P34. The tenth transistor N36 receives bias voltage 'Bias' through its gate and its drain is coupled with a node where the sources of the eighth and ninth transistors N34, N35 are coupled, and its source is coupled with a ground terminal 'VSS'. In this configuration, the output signal 'out' is outputted from a node where the seventh transistor P34 and the ninth transistor N35 are coupled.

The input buffer circuit of a semiconductor apparatus having the above configuration according to another embodiment of the present invention operates as follows.

The voltage dropper 110-2 decreases the voltage level of a second compare signal 'com_s2' less than the voltage level of a first compare signal 'com_s1', when the voltage level of an input signal 'in' becomes lower than the level of reference voltage 'Vref'. Further, the voltage dropper 110-2 decreases the voltage level of the first compare signal 'com_s1' less than the voltage level of the second compare signal 'com_s2' when the voltage level of the input signal 'in' becomes higher than the level of the reference voltage 'Vref'.

The comparator 'com' increases the voltage level of a control signal 'ctrl', when the voltage level of the second compare signal 'com_s2' becomes higher than the level of the reference voltage 'Vref', and decreases the voltage level of the control signal 'ctrl', when the voltage level of the second compare signal 'com_s2' becomes lower than the level of the reference voltage 'Vref'.

The variable resistor 121-2 adjusts the degree of increase of the voltage level of the first and second compare signals 'com_s1', 'com_s2', by controlling the resistance level in accordance with the voltage level of the control signal 'ctrl'. For example, the variable resistor 121-2 increases the voltage level of the first and second compare signals 'com_s1', 'com_s2' more than when the voltage level of the control signal 'ctrl' is higher, when the voltage level of the control signal 'ctrl' decreases.

The voltage dropper 110-2 decreases the voltage level of the first and second compare signals 'com_s1', 'com_s2' less than a predetermined level, when the level of bias voltage 'Bias' is increased by the increase in the level of external voltage 'VDD'. However, the voltage applier 120-2 including the comparator 'com' and the variable resistor 121-2 operate to increase the voltage level of the first and second compare signals 'com_s1', 'com_s2' more than when the second compare signal 'com_s2' is higher than the level of the reference voltage 'Vref', when signal 'com_s2' becomes lower than the level of the reference voltage 'Vref'.

Therefore, the input buffer circuit of a semiconductor apparatus according to another embodiment of the present invention can generate first and second compare signals 'com_s1', 'com_s2' at a predetermined level, even if external voltage 'VDD' increases. As a result, the input buffer circuit according to the embodiment of the present invention can generate a normal output signal 'out' by comparing the voltage levels of the first compare signal 'com_s1' at a predetermined level and the input signal 'in', even if the level of the external voltage 'VDD' increases.

Meanwhile, the voltage dropper 110-2 cannot decrease the level of the first and second compare signals 'com_s1', 'com_s2' by the predetermined level, when the level of the bias voltage 'Bias' decreases due to a level drop of the external voltage 'VDD'. However, the voltage applier 120-2 prevents the voltage level of the first and second compare signals 'com_s1', 'com_s2' from increasing more than when the second compare signal 'com_s2' is lower than the level of the reference voltage 'Vref', when the second compare signal 'com_s2' becomes higher than the level of the reference voltage 'Vref'.

Therefore, the input buffer circuit of a semiconductor apparatus according to an embodiment of the present invention can generate first and second compare signals 'com_s1', 'com_s2' at a predetermined level, even if the level of external voltage 'VDD' deceases. As a result, the input buffer circuit according to the embodiment of the present invention can generate a normal output signal 'out' by comparing the voltage levels of the first compare signal 'com_s1' at a predetermined level and the input signal 'in', even if the level of the external voltage 'VDD' drops.

Figure 7:
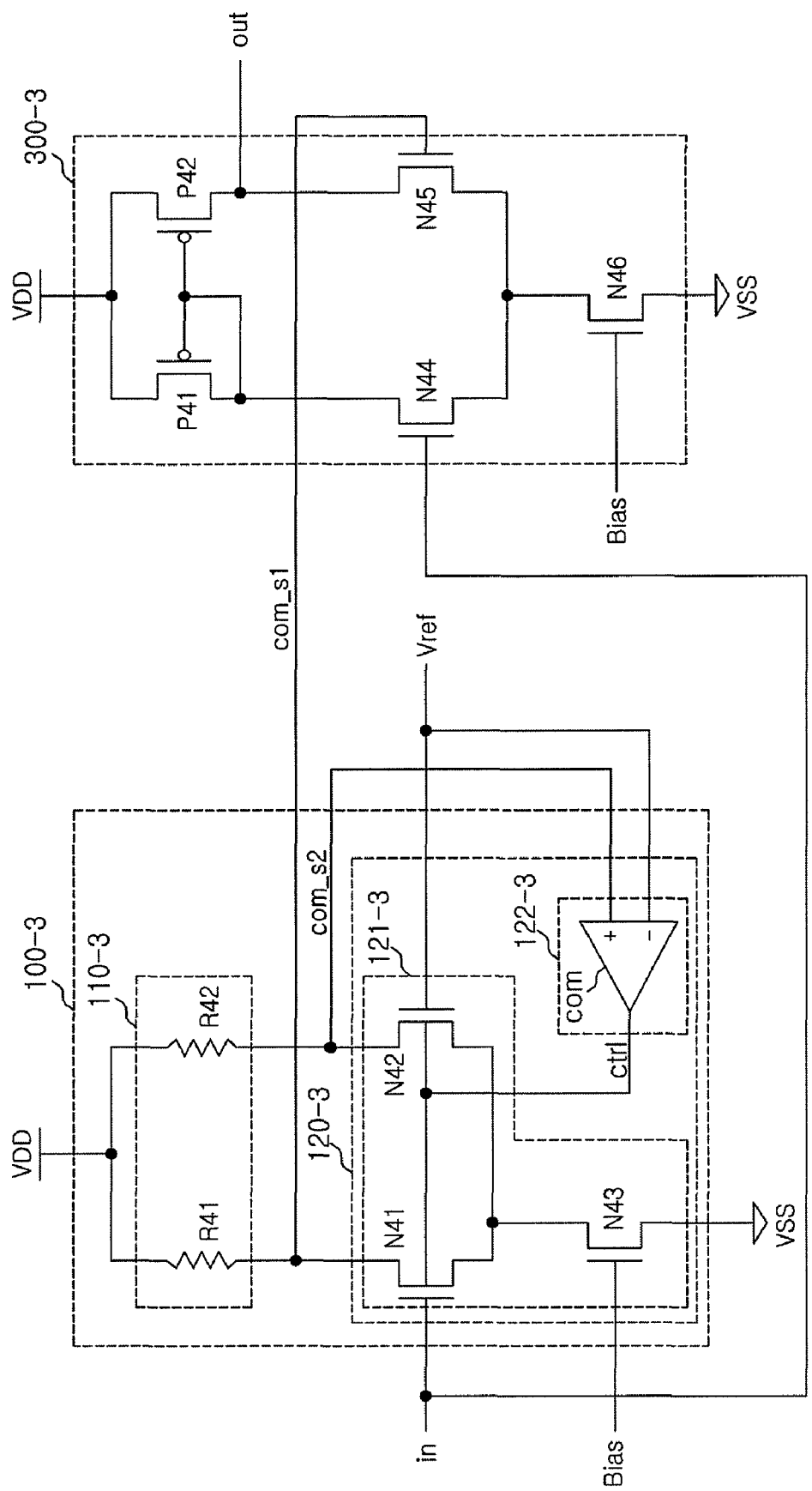
FIG. 7 is a diagram illustrating an input buffer of a semiconductor apparatus according to another embodiment of the present invention.

An input buffer circuit of a semiconductor apparatus according to another embodiment of the present invention, as shown in FIG. 7, includes a first buffering unit 100-3 and a second buffering unit 300-3.

The first buffering unit 100-3 includes a fixed resistance 110-3 and a voltage dropper 120-3.

The fixed resistance 110-3 increases the voltage level of a first compare signal 'com_s1' and a second compare signal 'com_s2' by receiving external voltage.

The fixed resistance 110-3 includes first and second resistors R41, R42.

The first resistor R41 receives external voltage 'VDD' through one end and the other end is coupled with the voltage dropper 120-3. The second resistor R42 receives the external voltage 'VDD' through one end and the other end is coupled with the voltage dropper 120-3. In this configuration, the first compare signal 'com_s1' is outputted from a node where the first resistor R41 and the voltage dropper 120-3 are coupled and the second compare signal 'com_s2' is outputted from a node where the second resistor R42 and the voltage dropper 120-3 are coupled.

The voltage dropper 120-3 includes a signal voltage dropper 121-3 and a control signal generator 122-3.

The signal voltage dropper 121-3 includes first to third transistors N41, N42, N43. The first transistor N41 decreases the voltage level of the first compare signal 'com_s1' in response to the voltage level of an input signal 'in'. The second transistor N42 decreases the voltage level of the second compare signal 'com_s2' in response to the voltage level of reference voltage 'Vref'. For example, the higher the voltage level of the input signal 'in', the more the first transistor N41 decreases the voltage level of the first compare signal 'com_s1'. The higher the voltage level of the reference voltage 'Vref' the more the second transistor N4 decreases the voltage level of the second compare signal 'com_s2'.

The first transistor N41 is coupled with the other end of the first resistor R41 at its drain, and receives the input signal 'in' through its gate. The second transistor N42 is coupled with the other end of the second resistor R42 at its drain and receives the reference voltage 'Vref' through its gate. The third transistor N43 receives bias voltage 'Bias' through its gate, its drain is coupled with a node where the sources of the first transistor N41 and the second transistor N42 are coupled, and its source is coupled with a ground terminal 'VSS'.

The control signal generator 122-3 generates a control signal 'ctrl' by comparing the voltage level of the second compare signal 'com_s2' with the level of the reference voltage 'Vref'. For example, the control signal generator 122-3 increases the voltage level of the control signal 'ctrl', when the voltage level of the second compare signal 'com_s2' is higher than the level of the reference voltage 'Vref'. On the other hand, the control signal generator 122-3 decreases the voltage level of the control signal 'ctrl', when the voltage level of the second compare signal 'com_s2' is lower than the level of the reference voltage 'Vref'. In this process, the control signal 'ctrl' is provided as back bias voltage of the first transistor N41 and the second transistor N42.

The second buffering unit 300-3 generates an output signal 'out' by comparing the voltage levels of the input signal 'in' and the first compare signal 'com_s1'.

The second buffering unit 300-3 includes fourth to eighth transistors P41, P42, N44, N45, N46. The fourth transistor P41 receives external voltage 'VDD' through its source, and its gate and drain are coupled. The fifth transistor P42 receives the external voltage 'VDD' through its source and its gate is coupled with the gate of the fourth transistor P41. The sixth transistor N44 receives the input signal 'in' through its gate and its drain is coupled with the drain of the fourth transistor P41. The seventh transistor N45 receives the first compare signal 'com_s1' through its gate and its drain is coupled with the drain of the fifth transistor P42. The eighth transistor N46 receives bias voltage 'Bias' through its gate, and its drain is coupled with a node where the sources of the sixth and seventh transistors N44, N45 are coupled, and its source is coupled with a ground terminal 'VSS'. In this configuration, the output signal 'out' is outputted from a node where the fifth transistor P42 and the seventh transistor N45 are coupled.

The input buffer circuit of a semiconductor apparatus having the above configuration according to another embodiment of the present invention operates as follows.

The fixed resistance 110-3 operates to increase the voltage level of the first and second compare signals 'com_s1', 'com_s2' by receiving external voltage 'VDD'.

The signal voltage dropper 121-3 decreases the voltage level of the second compare signal 'com_s2' less than the voltage level of the first compare signal 'com_s1', when the voltage level of the input signal 'in' becomes lower than the level of the reference voltage 'Vref'. Further, the signal voltage dropper 121-3 decreases the voltage level of the first compare signal 'com_s1' less than the voltage level of the second compare signal 'com_s2', when the voltage level of the input signal 'in' becomes higher than the level of the reference voltage 'Vref'.

The comparator 'com' increases the voltage level of the control signal 'ctrl', when the voltage level of the second compare signal 'com_s2' becomes higher than the level of the reference voltage 'Vref', and decreases the voltage level of the control signal 'ctrl', when the voltage level of the second compare signal 'com_s2' becomes higher than the level of the reference voltage 'Vref'.

The voltage level of the control signal 'ctrl' is provided as back bias voltage of the first transistor N41 and the second transistor N42. For example, the first transistor N41 increases the amount of current flowing from the drain to the source at the voltage level of the same input signal 'in' by dropping the threshold voltage level, when the voltage level of the control signal 'ctrl' increases. The second transistor N42 also increases the amount of current flowing from the drain to the source, when the voltage level of the control signal 'ctrl' increases. On the other hand, when the voltage level of the control signal 'ctrl' decreases, the threshold voltage level of the first and second transistors N41, N42 increases, such that the transistors N41, N42 transmit the less amount of current even at the same gate voltage level. Therefore, the first and second transistors N41, N42 can control the degree of decrease of the voltage level of the first and second compare signals 'com_s1', 'com_s2' in accordance with the voltage level of the control signal 'ctrl' even at the same gate voltage level.

When the level of the bias voltage 'Bias' is increased by the increase of the level of the external voltage 'VDD', the voltage level of the control signal 'ctrl' decreases such that the threshold voltage level of the first and second transistors N41, N42 increases, in order to substantially prevent the voltage level of the first compare signal 'com_s1' and the second compare signal 'com_s2' from decreasing below a predetermined voltage level.

Further, when the level of the bias voltage 'Bias' is decreased by the decrease of the level of the external voltage 'VDD', the voltage level of the control signal 'ctrl' increases such that the threshold voltage level of the first and second transistors N41, N42 decreases, in order to decrease the voltage level of the first and second compare signals 'com_s1', 'com_s2' by the predetermined voltage level.

As a result, the input buffer circuit of a semiconductor apparatus according to another embodiment of the present invention can generate first and second compare signals 'com_s1', 'com_s2' at a predetermined voltage level, even if the level of external voltage increases or decreases. Therefore, the input buffer circuit according to another embodiment of the present invention can generate a normal output signal 'out' by comparing the voltage levels of predetermined first compare signal 'com_s1' and the input signal 'in', even if the level of external voltage 'VDD' increases, such that it has an effect of improving the operational reliability of a semiconductor apparatus.

Figure 8:
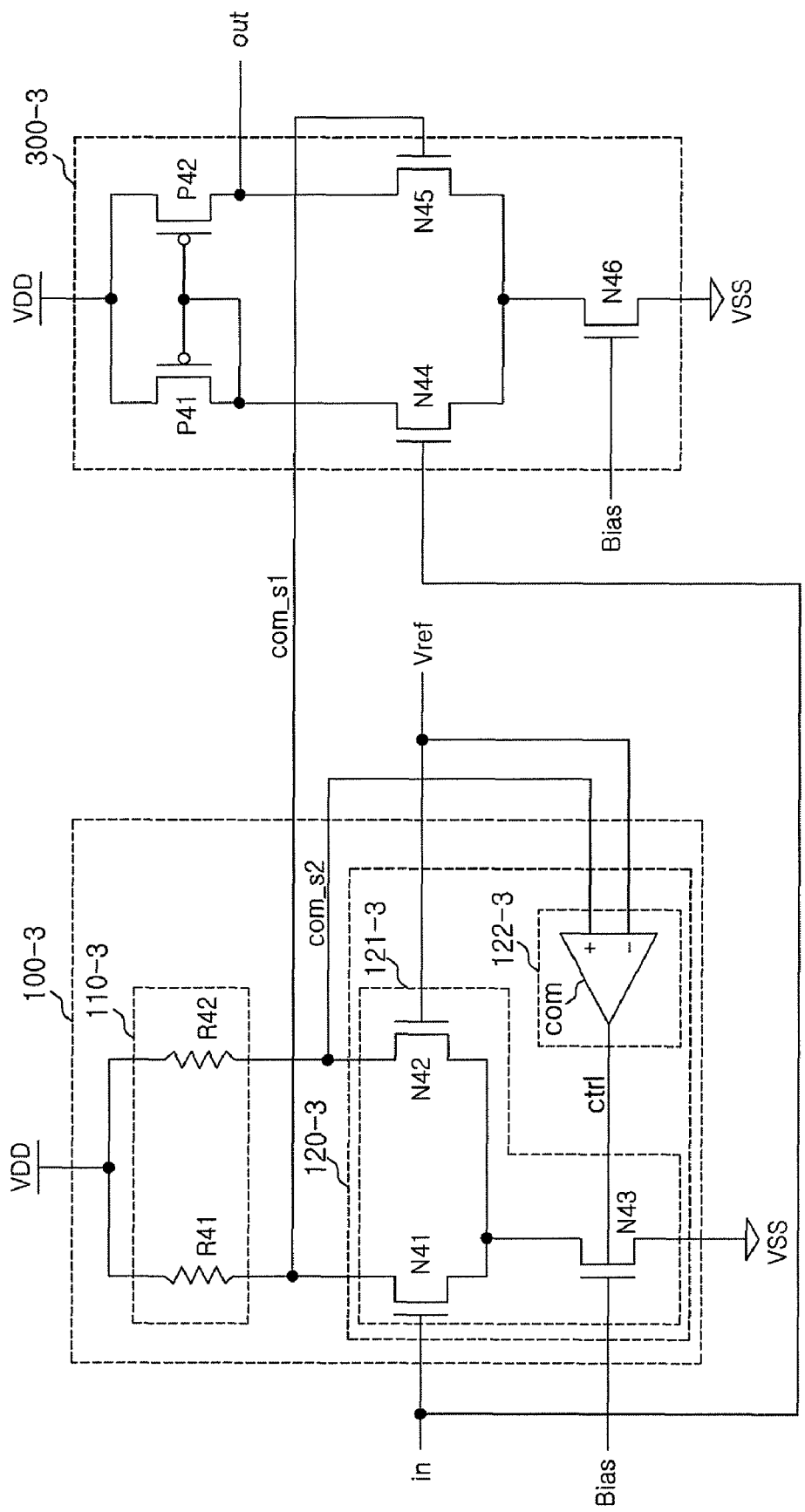
FIG. 8 is a diagram illustrating an input buffer of a semiconductor apparatus according to another embodiment of the present invention.

It is possible to achieve the same effect as the input buffer circuit of a semiconductor apparatus according to another embodiment of the present invention shown in FIG. 7, even by providing the voltage of a control signal 'ctrl' comparing the voltage levels of a second compare signal 'com_s2' with the reference voltage 'Vref' as back bias voltage of the third transistor 'N43', as shown in FIG. 8.

While certain embodiments have been described above, it will be understood that the embodiments described are by way of example only. Accordingly, the device and the method described herein should not be limited based on the described embodiments. Rather, the devices and methods described herein should only be limited in light of the claims that follow when taken in conjunction with the above description and accompanying drawings.

What is claimed is:

1. An input buffer circuit of a semiconductor apparatus, comprising:
   a first buffering unit configured to be activated by a voltage level difference between a source voltage terminal and a sink voltage terminal, generate a first compare signal and a second compare signal by comparing voltage levels of reference voltage and an input signal, and change voltage levels of the first compare signal and the second compare signal in response to an amount of current flowing between the sink voltage terminal and a ground terminal;
   a control unit configured to control the voltage levels of the first and second compare signals in response to a voltage level difference between the reference voltage and the second compare signal; and
   a second buffering unit configured to generate an output signal by comparing voltage levels of the input signal and the first compare signal.

2. The input buffer circuit of a semiconductor apparatus according to claim 1, wherein the first buffering unit is configured to
   generate the first compare signal at a lower voltage level than the voltage level of the second compare signal, when the voltage level of the input signal is higher than the level of the reference voltage, and
   generate the first compare signal at a higher voltage level than the voltage level of the second compare signal, when the voltage level of the input signal is lower than the level of the reference voltage.

3. The input buffer circuit of a semiconductor apparatus according to claim 2, wherein the control unit increases the amount of current flowing between the sink voltage terminal and a ground terminal, when the voltage level of the second compare signal is higher than the level of the reference voltage, and
   decreases the amount of current flowing between the sink voltage terminal and the ground terminal, when the voltage level of the second compare signal is lower than the level of the reference voltage.

4. The input buffer circuit of a semiconductor apparatus according to claim 3, wherein the control unit includes:
   a control signal generator configured to generate a control signal in response to the second compare signal and the reference voltage; and a current controller configured to increase or decrease the amount of current flowing between the sink voltage terminal and the ground terminal in response to a voltage level of the control signal.

5. The input buffer circuit of a semiconductor apparatus according to claim 4, wherein the control signal generator is configured to generate the control signal by comparing the voltage level of the second compare signal with the level of the reference voltage.

6. The input buffer circuit of a semiconductor apparatus according to claim 2, wherein the first buffering unit configured to include a fixed resistor increasing voltage levels of the first compare signal and the second compare signal by receiving external voltage through the source voltage terminal, and a voltage dropper decreasing the voltage levels of the first and second compare signals in response to the input signal and the reference voltage level.

7. The input buffer circuit of a semiconductor apparatus according to 6, wherein the voltage dropper includes a signal voltage dropper configured to include a first transistor decreasing the voltage level of the first compare signal in response to the voltage level of the input signal and a second transistor decreasing the voltage level of the second compare signal in response to the level of the reference voltage,
wherein the control unit includes a control signal generator configured to increase a voltage level of a control signal, when the voltage level of the second compare signal becomes higher than the level of the reference voltage,
wherein the first transistor and the second transistor receive the voltage of the control signal as their back bias voltages, and
wherein the first compare signal is outputted from a node where the first transistor and the fixed resistor are coupled, the second compare signal is outputted from a node where the second transistor and the fixed resistor are coupled, and a node where the first transistor and the second transistor are coupled is the sink voltage terminal.

8. The input buffer circuit of a semiconductor apparatus according to 6, wherein the voltage dropper includes the signal voltage dropper configured to include a first transistor that decreases the voltage level of the first compare signal in response to the voltage level of the input signal, a second transistor that decreases the voltage level of the second compare signal in response to the level of the reference voltage, and a third transistor that receives bias voltage through a gate, and having a drain coupled with the sink voltage terminal where sources of the first and second transistors are coupled and a source coupled with a ground terminal, and
wherein the control unit includes a control signal generator configured to increase a voltage level of a control signal, when the voltage level of the second compare signal becomes higher than the level of the reference voltage,
wherein the third transistor receives the voltage of the control signal as back bias voltage, and
wherein the first compare signal is outputted from a node where the first transistor and the fixed resistor are coupled, the second compare signal is outputted from a node where the second transistor and the fixed resistor are coupled.

9. The input buffer circuit of a semiconductor apparatus according to 1, wherein the first and second compare signals are signals swinging between CML (Current Mode Logic) levels, and the output signal is a signal swinging between CMOS (Complementary Metal Oxide Semiconductor) levels.

* * * * *